United States Patent
Choi et al.

(10) Patent No.: US 10,972,056 B2
(45) Date of Patent: Apr. 6, 2021

(54) BIAS CIRCUIT AND AMPLIFYING DEVICE WITH DUAL COMPENSATION

(71) Applicant: SAMSUNG ELECTRO-MECHANICS CO., LTD., Suwon-si (KR)

(72) Inventors: Kyu Jin Choi, Suwon-si (KR); Je Hee Cho, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 44 days.

(21) Appl. No.: 16/552,511

(22) Filed: Aug. 27, 2019

(65) Prior Publication Data
US 2020/0336115 A1 Oct. 22, 2020

(30) Foreign Application Priority Data
Apr. 18, 2019 (KR) .................. 10-2019-0045557

(51) Int. Cl.
*H03F 1/30* (2006.01)
*H03F 3/21* (2006.01)

(52) U.S. Cl.
CPC ............... *H03F 1/30* (2013.01); *H03F 3/21* (2013.01); *H03F 2200/447* (2013.01)

(58) Field of Classification Search
CPC ........................................................ H03F 1/30
See application file for complete search history.

(56) References Cited

U.S. PATENT DOCUMENTS

| 3,970,876 A * | 7/1976 | Allen ...................... G05F 3/30 326/32 |
| 6,492,874 B1 | 12/2002 | Shih |
| 10,095,259 B1 * | 10/2018 | Antunes Ribafeita .... G05F 3/16 |
| 2004/0189398 A1 | 9/2004 | Noh et al. |
| 2004/0251967 A1 * | 12/2004 | Moriwaki ............... H03F 3/189 330/296 |
| 2007/0222520 A1 * | 9/2007 | Inamori .................... H03F 1/30 330/289 |
| 2007/0296503 A1 * | 12/2007 | Nakayama .............. H03F 3/189 330/296 |

(Continued)

FOREIGN PATENT DOCUMENTS

| JP | 2009-253728 A | 10/2009 |
| KR | 10-2003-0031073 A | 4/2003 |
| KR | 10-2004-0028963 A | 4/2004 |

OTHER PUBLICATIONS

Korean Office Action dated Aug. 31, 2020 in counterpart Korean Patent Application No. 10-2019-0045557 (6 pages in English, 4 pages in Korean).

*Primary Examiner* — Patricia T Nguyen
(74) *Attorney, Agent, or Firm* — NSIP Law

(57) ABSTRACT

A bias circuit includes a current generating circuit generating a first compensation current and a second compensation current, in which an ambient temperature change is reflected, based on a reference current, a first temperature compensation circuit generating a first base bias current, based on the first compensation current, to output the first base bias current to a base node of an amplifying circuit, and a second temperature compensation circuit generating a second base bias current, based on the second compensation current, to output the second base bias current to the base node of the amplifying circuit.

20 Claims, 14 Drawing Sheets

(56) References Cited

U.S. PATENT DOCUMENTS

| | | | |
|---|---|---|---|
| 2008/0174356 A1* | 7/2008 | Yamamoto | H03F 3/211 |
| | | | 327/362 |
| 2009/0140792 A1* | 6/2009 | Horie | H03F 1/302 |
| | | | 327/513 |
| 2009/0251220 A1 | 10/2009 | Matsuda et al. | |
| 2010/0176869 A1* | 7/2010 | Horie | H03F 3/195 |
| | | | 327/513 |

* cited by examiner

BIAS CIRCUIT AND AMPLIFYING DEVICE WITH DUAL COMPENSATION

CROSS-REFERENCE TO RELATED APPLICATION(S)

This application claims the benefits under U.S.C. § 119(a) of Korean Patent Application No. 10-2019-0045557 filed on Apr. 18, 2019 in the Korean Intellectual Property Office, the entire disclosure of which is incorporated herein by reference for all purposes.

BACKGROUND

Field

The following description relates to a bias circuit having a dual compensation function and an amplifying device.

Description of Background

In general, a wireless communication system includes an amplifying device for amplifying a transmitted signal. In order to meet the demand for the diffusion of multimedia services of a wireless communications system and high-speed communications function, research for the continuous development of technology and improvements of broadband characteristics and nonlinear characteristics is being continued.

In an amplifying device, the linearity of a power amplifier such as a heterojunction bipolar transistor (HBT) and a bias level have a strong correlation. In general, when a power transistor is biased to a high level, it has the excellent linearity performance.

However, when the amplifying device is operated at a high temperature, a turn-on voltage Vth of the PN junction between the base and the emitter (base-emitter) is lowered due to the temperature characteristics of a device of the HBT. In this case, a base bias level becomes low as well.

Accordingly, due to the base bias level being lowered during a high temperature operation, there may be a problem in that linearity of the power amplifier is deteriorated. In order to overcome such a problem, a solution has been proposed, in which a proportion to absolute temperature (PTAT) bias for increasing an external bias current when an amplifier is operated at a high temperature is used. However, in such a method, there may be a technical difficulty, such as a temperature of a HBT power transistor being accurately sensed, and an external circuit is additionally required to implement this, so a circuit, included in an amplifying device, may become more complicated.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

A dual compensation bias circuit and an amplifying device, capable of efficiently compensating a base bias current which may vary depending on an ambient temperature, using a dual temperature compensation function, to reflect an ambient temperature change, in a current bias circuit.

In one general aspect, a bias circuit includes: a current generating circuit generating a first compensation current and a second compensation current, in which an ambient temperature change is reflected, based on a reference current; a first temperature compensation circuit generating a first base bias current, based on the first compensation current, to output the first base bias current to a base node of an amplifying circuit; and a second temperature compensation circuit generating a second base bias current, based on the second compensation current, to output the second base bias current to the base node of the amplifying circuit.

In another general aspect, an amplifying device includes: an amplifying circuit having an amplifying transistor; and a bias circuit generating a base bias current, in which a temperature is compensated, to output the base bias current to a base node of the amplifying circuit, and the bias circuit includes: a current generating circuit generating a first compensation current and a second compensation current, in which an ambient temperature change is reflected, based on a reference current; a first temperature compensation circuit generating a first base bias current, based on the first compensation current, to output the first base bias current to the base node of the amplifying circuit; and a second temperature compensation circuit generating a second base bias current, based on the second compensation current, to output the second base bias current to the base node of the amplifying circuit.

The current generating circuit may include: a first resistor having a first end connected to a terminal of the reference current; a second resistor having a first end connected to a second end of the first resistor; and a temperature compensation transistor connected between a second end of the second resistor and the ground, and connected to an amplifying transistor of the amplifying circuit while having a current mirror structure.

The current generating circuit may output the first compensation current at a first connection node between the first resistor and the second resistor, and may output the second compensation current at a second connection node between the second resistor and a collector of the temperature compensation transistor.

The temperature compensation transistor may have the same temperature characteristics as the temperature characteristics of the amplifying transistor.

The first temperature compensation circuit may include: a first compensation transistor having a base connected to the first connection node, a collector connected to a terminal of a power supply voltage, and an emitter connected to the base node of the amplifying circuit.

The first compensation transistor may amplify the first compensation current, input to the base, to output the first base bias current through the emitter to the base node of the amplifying circuit.

The second temperature compensation circuit may include: a second compensation transistor having a base connected to the second connection node, a collector connected to the collector of the first compensation transistor, and an emitter connected to the base node of the amplifying circuit.

The second compensation transistor may amplify the second compensation current, input to the base, to output the second base bias current through the emitter to the base node of the amplifying circuit.

A 3-stage power amplifying circuit may include a first power amplifying circuit; a second power amplifying circuit; and a third power amplifying circuit including the bias circuit.

In another general aspect, a power amplifier circuit includes: an amplifying circuit including a first transistor; and a bias circuit including a second transistor that is a current mirror with the first transistor, and that generates a first base bias current and a second base bias current based on a change in ambient temperature and outputs the first base bias current and the second base bias current to a base node of the amplifying circuit, A base of the second transistor is connected to the base node.

The bias circuit may include a third transistor to generate the first base bias current and a fourth transistor to generate the second base bias current.

The power amplifier circuit may include a capacitor connected between the base of the second transistor and the base node.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
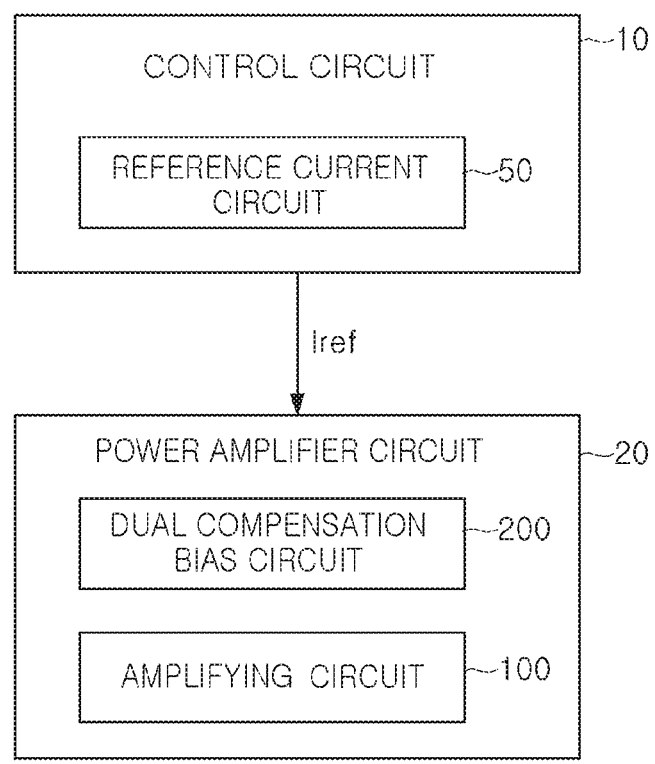
FIG. 1 is a view of an amplifying device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view of an amplifying device according to an example.

Referring to FIG. 1, an amplifying device may include a control circuit 10 and a power amplifier circuit 20.

The control circuit 10 may include a reference current circuit 50. The reference current circuit 50 may generate a reference current Iref and the reference current Iref may be output to the power amplifying circuit 20.

The power amplifying circuit 20 may include an amplifying circuit 100 and a dual compensation bias circuit 200.

Figure 2:
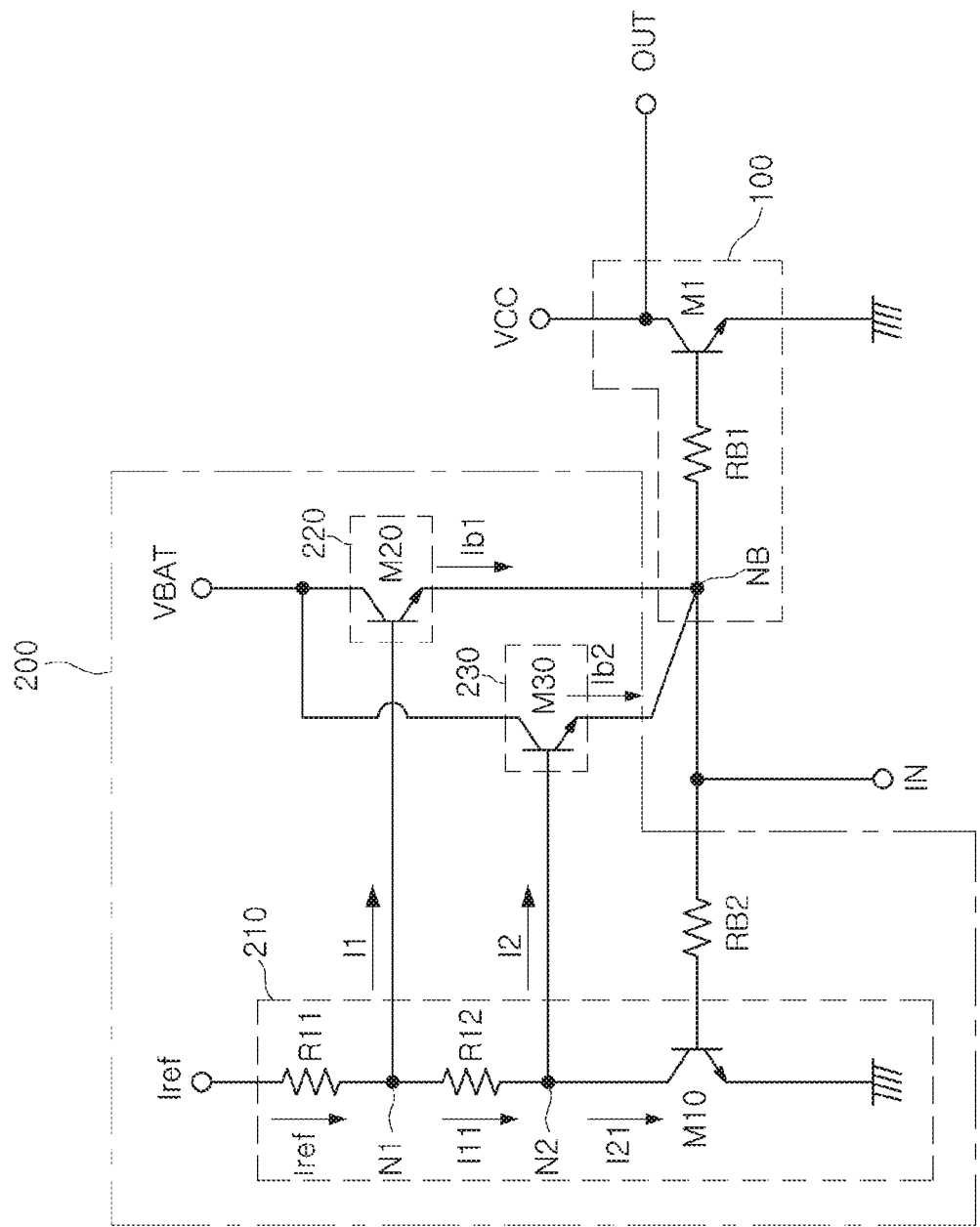
FIG. 2 is a view of a dual compensation bias circuit and an amplification circuit according to an example.
Figure 3:
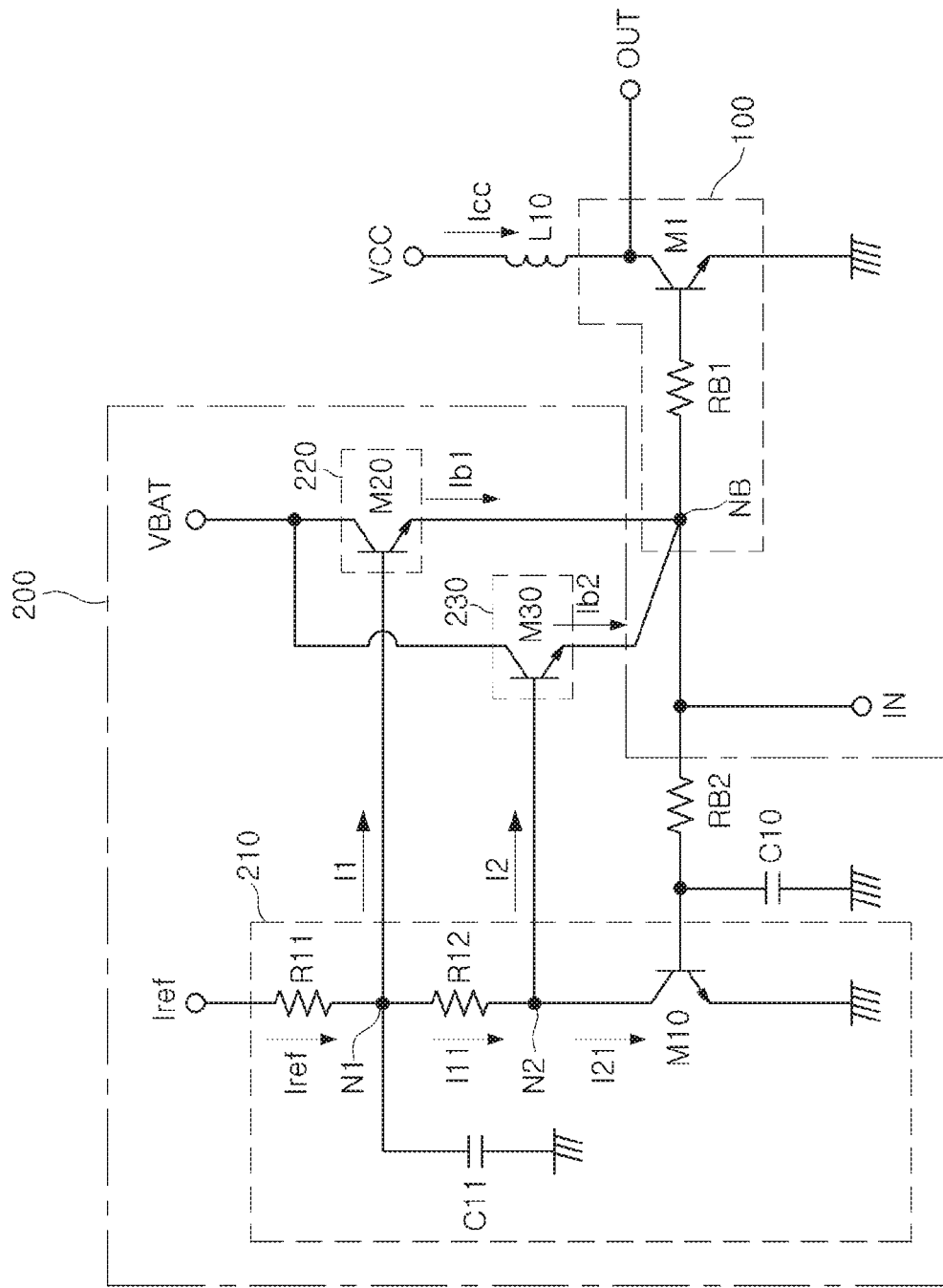
FIG. 3 is a view of a dual compensation bias circuit and an amplification circuit according to an example.

FIG. 2 is a view of a dual compensation bias circuit and an amplifying circuit according to an example, and FIG. 3 is a view of a dual compensation bias circuit and an amplifying circuit according to an example.

Referring to FIGS. 2 and 3, the dual compensation bias circuit 200 may include a current generating circuit 210, a first temperature compensation circuit 220, and a second temperature compensation circuit 230.

The current generating circuit 210 may generate a first compensation current I1 and a second compensation current I2, in which an ambient temperature change is reflected, based on a reference current Iref.

The first temperature compensation circuit 220 may amplify the first compensation current I1, which is input to generate a first base bias current Ib1 and output the first base bias current Ib1 to a base node NB of the amplifying circuit 100.

The second temperature compensation circuit 230 may amplify the second compensation current I2, which is input to generate a second base bias current Ib2, and output the second base bias current Ib2 to the base node NB of the amplifying circuit 100.

The amplifying circuit 100 may include an amplifying transistor M1 receiving a base bias current 'Ib1+Ib2' obtained by adding the first base bias current Ib1 and the second base bias current Ib2.

For example, referring to FIGS. 2 and 3, the current generating circuit 210 may include a first resistor R11, a second resistor R12, and a temperature compensation transistor M10.

The first resistor R11 may include one end connected to a terminal of the reference current Iref, and the other end connected to one end of the second resistor R12.

The second resistor R12 may include one end connected to the other end of the first resistor R11, and the other end connected to a collector of the temperature compensation transistor M10.

The temperature compensation transistor M10 may include a collector connected to the other end of the second resistor R12, an emitter connected to the ground, and a base connected to a base of the amplifying transistor M1 through resistors RB1 and RB2. The temperature compensation transistor M10 may be connected to the amplifying transistor M1 of the amplifying circuit 100 while having a current mirror structure.

Accordingly, a current, corresponding to a current flowing through the amplifying transistor M1, may flow through the temperature compensation transistor M10. For example, when a current, flowing through the amplifying transistor M1, is increased according to an ambient temperature change, a current, flowing through the temperature compensation transistor M10, may be increased. On the other hand, when a current, flowing through the amplifying transistor M1, is decreased, a current, flowing through the temperature compensation transistor M10, may be decreased.

The current generating circuit 210 outputs the first compensation current I1 at a first connection node N1 between the first resistor R11 and the second resistor R12, and may output the second compensation current I2 at a second connection node N2 between the second resistor R12 and a collector of the temperature compensation transistor M10.

The temperature compensation transistor M10 may be the same type of transistor (for example, a bipolar junction transistor (BJT) or a heterojunction bipolar transistor (HBT)) as the amplifying transistor M1, so that temperature compensation transistor M10 has the same temperature characteristics as those of the amplifying transistor M1.

In the amplifying transistor M1 and the temperature compensation transistor M10, according to an ambient temperature change, due to temperature characteristics of a transistor (for example, a heterojunction bipolar transistor (HBT) or a bipolar junction transistor (BJT)), a turn-on voltage Vth (or a threshold voltage) of a P-N junction between a base and an emitter (base-emitter) may be changed.

For example, when an ambient temperature is increased to a high temperature, a turn-on voltage Vth (or a threshold voltage) of the amplifying transistor M1 and the temperature compensation transistor M10 is decreased, a bias point is decreased, a turn-on voltage and a base-emitter voltage Vbe are decreased, and a base bias current is also decreased. Accordingly, when a current, flowing in the amplifying transistor M1, is decreased, a current, flowing through the temperature compensation transistor M10, may be decreased.

On the other hand, when an ambient temperature is decreased to a low temperature, a turn-on voltage Vth (or a threshold voltage) of the amplifying transistor M1 and the temperature compensation transistor M10 is increased, a bias point is increased, a turn-on voltage and a base-emitter voltage Vbe are increased, and a base bias current is also increased. Accordingly, when a current, flowing in the amplifying transistor M1, is increased, a current, flowing through the temperature compensation transistor M10, may be increased.

For example, the first temperature compensation circuit 220 may include a first compensation transistor M20. The first compensation transistor M20 may include a base connected to the first connection node N1 between the first resistor R11 and the second resistor R12, a collector connected to a terminal of a power supply voltage VBAT, and an emitter connected to the base node NB of the amplifying circuit 100.

The first compensation transistor M20 may amplify the first compensation current I1, input to the base, to output the first base bias current Ib1 to the base node NB of the amplifying circuit 100 through the emitter.

As an example, when an ambient temperature is decreased to a low temperature, the first compensation current I1 is decreased, and thus the first base bias current Ib1 is also decreased. Alternatively, when the ambient temperature is increased to a high temperature, the first compensation current I1 is increased, and thus the first base bias current Ib1 is also increased.

For example, the second temperature compensation circuit 230 may include a second compensation transistor M30. The second compensation transistor M30 may include a base connected to the second connection node N2 between the second resistor R12 and a collector of the temperature compensation transistor M10, a collector connected to a collector of the first compensation transistor M20, and an emitter connected to the base node NB of the amplifying circuit 100.

The second compensation transistor M30 may amplify the second compensation current I2, input to the base, to output the second base bias current Ib2 to the base node NB of the amplifying circuit 100 through the emitter.

As an example, when an ambient temperature is decreased to a low temperature, the second compensation current I2 is decreased, and thus the second base bias current Ib2 is also decreased. Alternatively, when the ambient temperature is increased to a high temperature, the second compensation current I2 is increased, and thus the second base bias current Ib2 is also increased.

In order to perform a dual compensation function, the first temperature compensation circuit 220 and the second temperature compensation circuit 230 are included. Thus, at a base node NB of the amplifying circuit 100, a first base bias current Ib1 and a second base bias current Ib2, from the first temperature compensation circuit 220 and the second temperature compensation circuit 230, respectively, are added, so a temperature compensation function may be improved.

Referring to FIG. 3, the current generating circuit 210 may further include a capacitor C11 connected between a first connection node N1, between a first resistor R11 and a second resistor R12, and the ground, and a capacitor C10 connected between a base of the temperature compensation transistor M10 and the ground.

The capacitor C11 may stabilize a voltage between the first connection node N1 and the ground, and a voltage between the second connection node N2 and the ground. The capacitor C10 may stabilize a base voltage of the temperature compensation transistor M10.

Moreover, between a collector of the amplifying transistor M1 and a terminal of the power supply voltage VCC, a coil L10 may be connected to block noise of a power supply voltage.

The temperature compensation operation, described above, will be further described.

Referring to FIGS. 2 and 3, the reference current Iref may be divided into a first compensation current I1 and a first internal current I11 at a first connection node N1. The first internal current I11 may be divided into a second compensation current I2 and a second internal current I21 at a second connection node N2.

For example, when the amplifying transistor M1 and the temperature compensation transistor M10 are transistors (BJT or HBT) having the same temperature characteristics, and an ambient temperature is decreased or increased, due to the transistor characteristics, a threshold voltage Vth of each of the amplifying transistor M1 and the temperature compensation transistor M10 is increased or decreased, so a collector-emitter current of the amplifying transistor M1 is also increased or decreased. In this case, it is required that the collector-emitter current of the amplifying transistor M1 be compensated.

As an example, when an ambient temperature is decreased, due to the transistor characteristics, a threshold voltage Vth of each of the amplifying transistor M1 and the temperature compensation transistor M10 is increased, and thus a collector-emitter current of each of the amplifying transistor M1 and the temperature compensation transistor M10 is also increased. In this case, while the reference current Iref is constant, the first internal current I11 and the second internal current I21, flowing through the temperature compensation transistor M10, are increased.

Accordingly, the first compensation current I1 and the second compensation current I2 are decreased, a first base bias current Ib1, generated based on the first compensation current I1, is decreased, and a second base bias current Ib2, generated based on the second compensation current I2, is also decreased. Thus, due to an increase in a collector-emitter current of the amplifying transistor M1, the first base bias current Ib1 and the second base bias current Ib2 are decreased, so an increase in the base bias current may be compensated.

As another example, when an ambient temperature is increased, due to the transistor characteristics, a threshold voltage Vth of each of the amplifying transistor M1 and the temperature compensation transistor M10 is decreased, and thus a collector-emitter current of each of the amplifying transistor M1 and the temperature compensation transistor M10 is also decreased. In this case, while the reference current Iref is constant, the first internal current I11 and the second internal current I21, flowing through the temperature compensation transistor M10, are decreased.

Accordingly, the first compensation current I1 and the second compensation current I2 are increased, a first base bias current Ib1, generated based on the first compensation current I1, is increased, and a second base bias current Ib2, generated based on the second compensation current I2, is also increased. Thus, due to a decrease in a collector-emitter current of the amplifying transistor M1, the first base bias current Ib1 and the second base bias current Ib2 are increased, so a decrease in the base bias current may be compensated.

Figure 4:
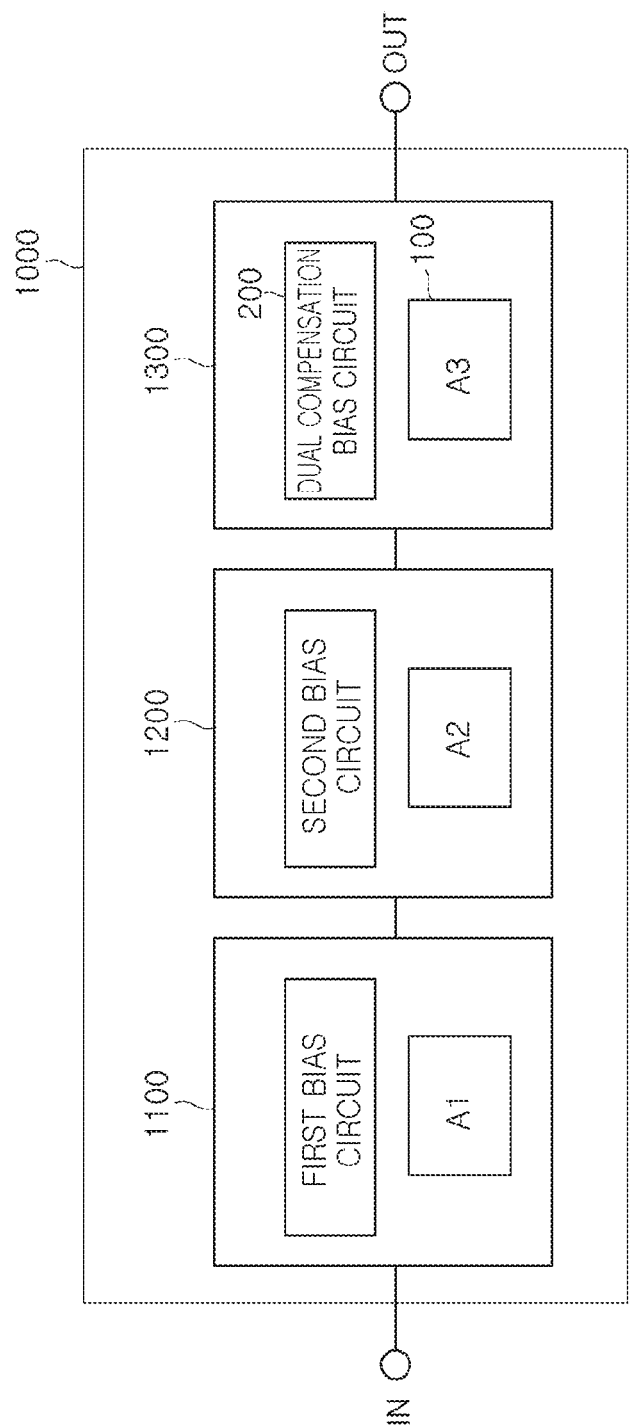
FIG. 4 is a view to which an amplifying device according to an example is applied.

FIG. 4 is a view to which an amplifying device according to an example is applied.

Referring to FIG. 4, an amplifying device may be applied to a 3-stage power amplifying circuit 1000 having three power amplifying circuits, such as first, second, and third power amplifying circuits 1100, 1200, and 1300.

The dual compensation bias circuit 200 described above may be applied to at least one among the first power amplifying circuit 1100, the second power amplifying circuit 1200, and the third power amplifying circuit 1300.

In FIG. 4, an example is illustrated in which the dual compensation bias circuit 200 is applied to the third power amplifying circuit 1300, a final stage having a main impact on a performance change according to a temperature, among the first, second, and third power amplifying circuits 1100, 1200, and 1300 of the 3-stage power amplifying circuit.

The first power amplifying circuit 1100 may include a first bias circuit and a first amplifying circuit A1, while the second power amplifying circuit 1200 may include a second bias circuit and a second amplifying circuit A2.

The third power amplifying circuit 1300 may include the dual compensation bias circuit 200 and a third amplifying circuit A3, such as the amplifying circuit 100 described above.

Figure 5:
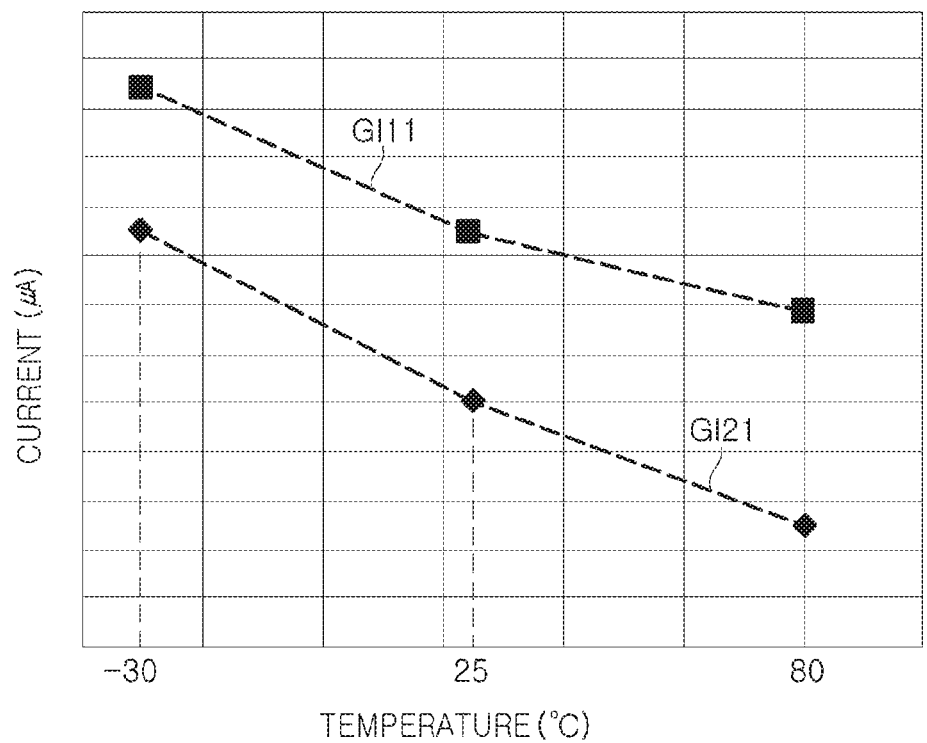
FIG. 5 is a graph illustrating first and second internal current characteristics.
Figure 6:
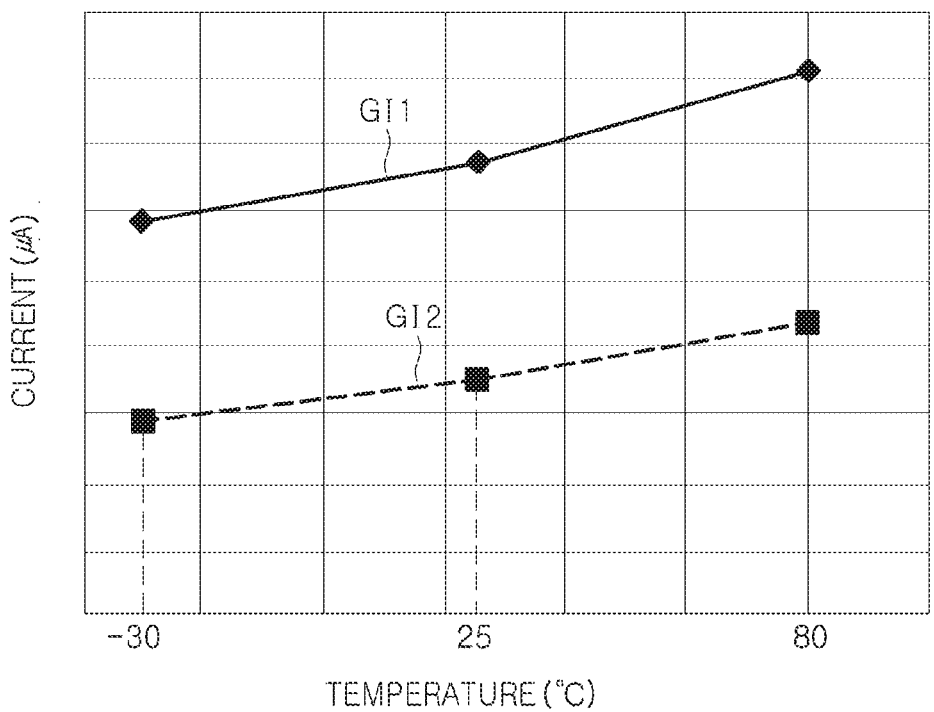
FIG. 6 is a graph illustrating first and second compensation current characteristics.

FIG. 5 is a graph illustrating first and second internal current characteristics, and FIG. 6 is a graph illustrating first and second compensation current characteristics.

In FIG. 5, GI11 is a graph of a first internal current I11 according to a temperature change, and GI21 is a graph of a second internal current I21 according to a temperature change.

Referring to GI11 and GI21 illustrated in FIG. 5, when a temperature is decreased, each of the first internal current I11 and the second internal current I21 is increased. On the other hand, when the temperature is increased, each of the first internal current I11 and the second internal current I21 is decreased.

In FIG. 6, GI1 is a graph of a first compensation current I1 according to a temperature change, while GI2 is a graph of a second compensation current I2 according to a temperature change.

Referring to GI11 and GI21, illustrated in FIG. 5, as well as GI1 and GI2, illustrated in FIG. 6, when a temperature is decreased, while a reference current Iref is constant, each of the first internal current I11 and the second internal current I21 is increased, so each of the first compensation current I1 and the second compensation current I2 is decreased. In addition, when a temperature is increased, while a reference current Iref is constant, each of the first internal current I11 and the second internal current I21 is decreased, so each of the first compensation current I1 and the second compensation current I2 is increased.

Figure 7:
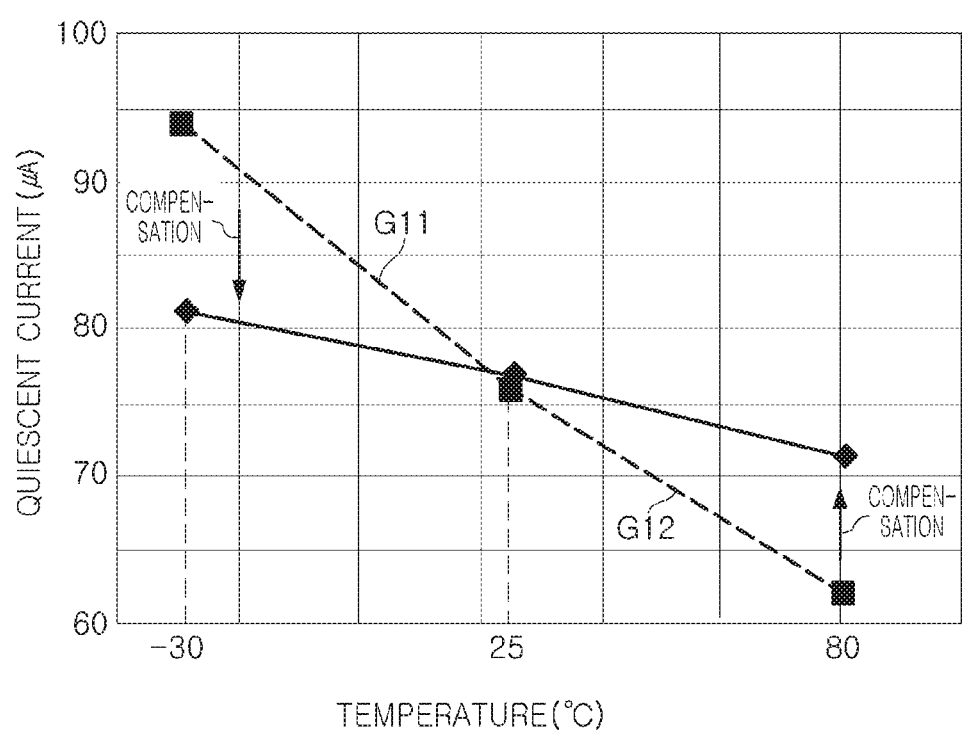
FIG. 7 is a graph illustrating temperature-Quiescent current characteristics.

FIG. 7 is a graph illustrating temperature-Quiescent current characteristics.

The graph of FIG. 7 is a graph illustrating characteristics of a temperature-Quiescent current according to the simulation result of a Quiescent current according to a temperature, when the bias circuit according to an example is applied to the third power amplifying circuit 1300, a final stage, among the first, second, and third power amplifying circuits 1100, 1200, and 1300 of the 3-stage power amplifying circuit 1000 of FIG. 4.

G11, illustrated in FIG. 7, is a graph of temperature-Quiescent current characteristics of a bias circuit according to the related art, while G12 is a graph of temperature-Quiescent current characteristics of a bias circuit according to an example described herein.

G11 and G12 of FIG. 7 are results of simulation at 3-points of −30 degrees (low temperature), 25 degrees (room temperature), and 80 degrees (high temperature). Here, referring to G11 and G12, when a bias circuit according to the related art is applied, a deviation of a Quiescent current according to a temperature is up to a level of 32 mA (62 mA to 94 mA). However, when a bias circuit including a temperature compensation circuit according to an example described herein is applied, a deviation of a Quiescent current according to a temperature is reduced up to 9 mA (72 mA to 81 mA), which is reduced to approximately one third of a previous level. Accordingly, according to an example described herein, it is confirmed that a deviation of a bias point according to a temperature could be reduced.

Figure 8A:
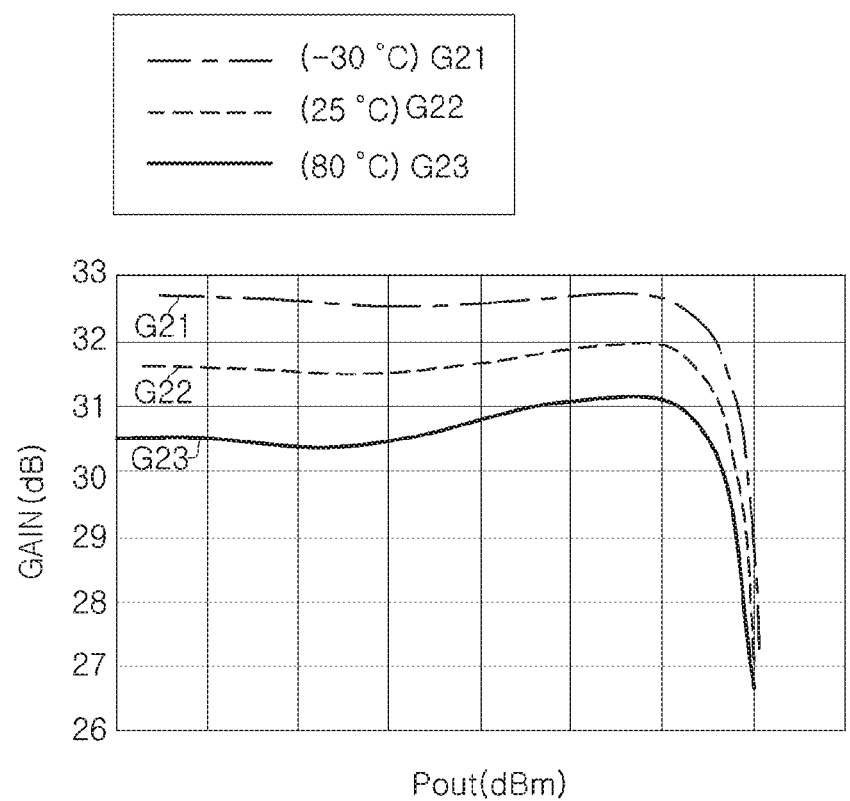
FIGS. 8A and 8B are graphs illustrating output power-gain characteristics according to a temperature change.
Figure 8B:
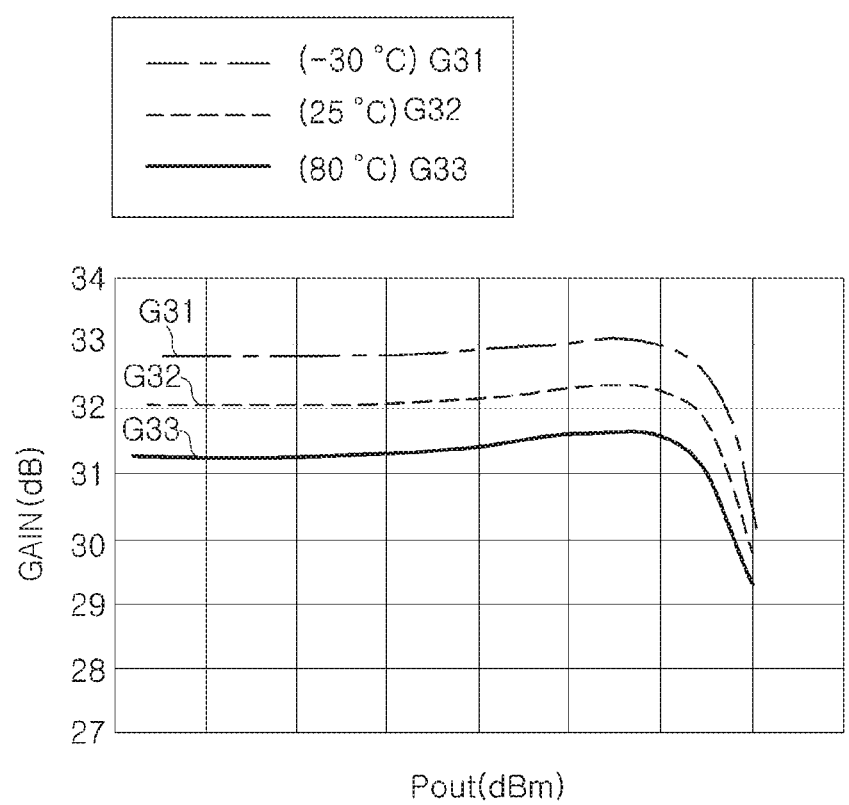

FIG. 8A is a graph of output power-gain characteristics according to a temperature change by a bias circuit according to the related art, while FIG. 8B is a graph of output power-gain characteristics according to a temperature change by a bias circuit according to an example described herein.

Respective G21, G22, and G23 of FIG. 8A are graphs of output power-gain characteristics according to a temperature change by a bias circuit according to the related art, at respective 3-points of −30 degrees (low temperature), 25 degrees (room temperature), and 80 degrees (high temperature). Respective G31, G32, and G33 of FIG. 8B are graphs of output power-gain characteristics according to a temperature change by a bias circuit according to an example described herein, at respective 3-points of −30 degrees (low temperature), 25 degrees (room temperature), and 80 degrees (high temperature).

Referring to G21, G22, and G23 of FIG. 8A, when a bias circuit according to the related art is applied, a deviation of output power gain according to a temperature change is up to a level of 2.6 dB. However, referring to G31, G32, and G33 of FIG. 8B, when a bias circuit having a temperature compensation circuit according to an example described herein is applied, a deviation is reduced by up to 1.8 dB.

Figure 9A:
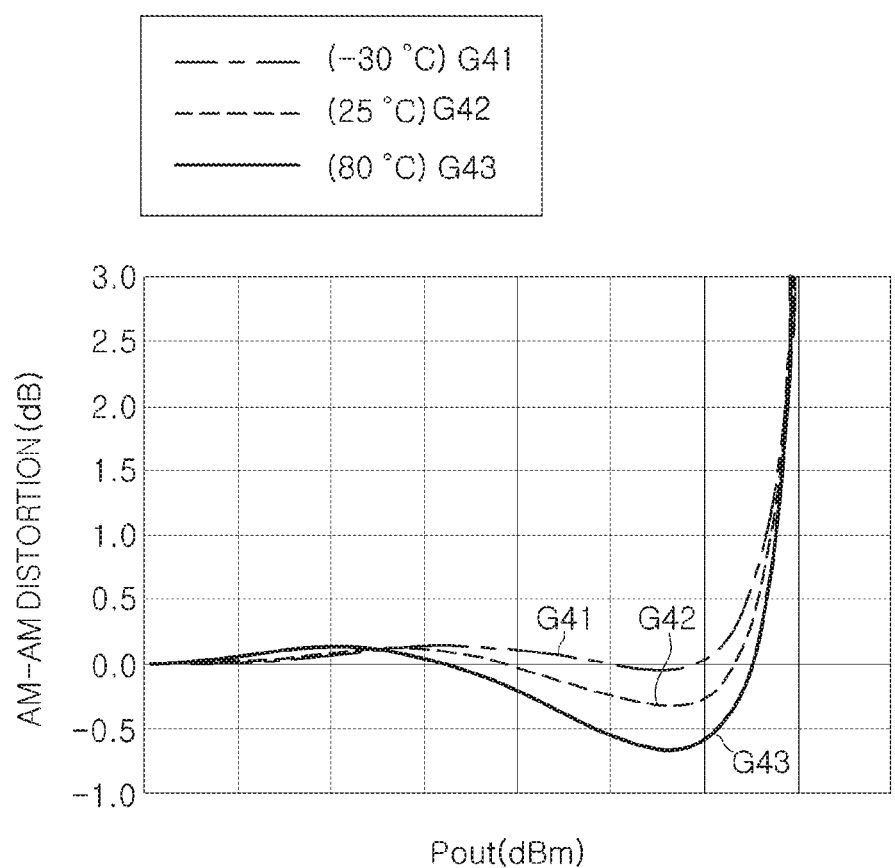
FIGS. 9A and 9B are graphs illustrating output power-AM-AM distortion characteristics according to a temperature change.
Figure 9B:
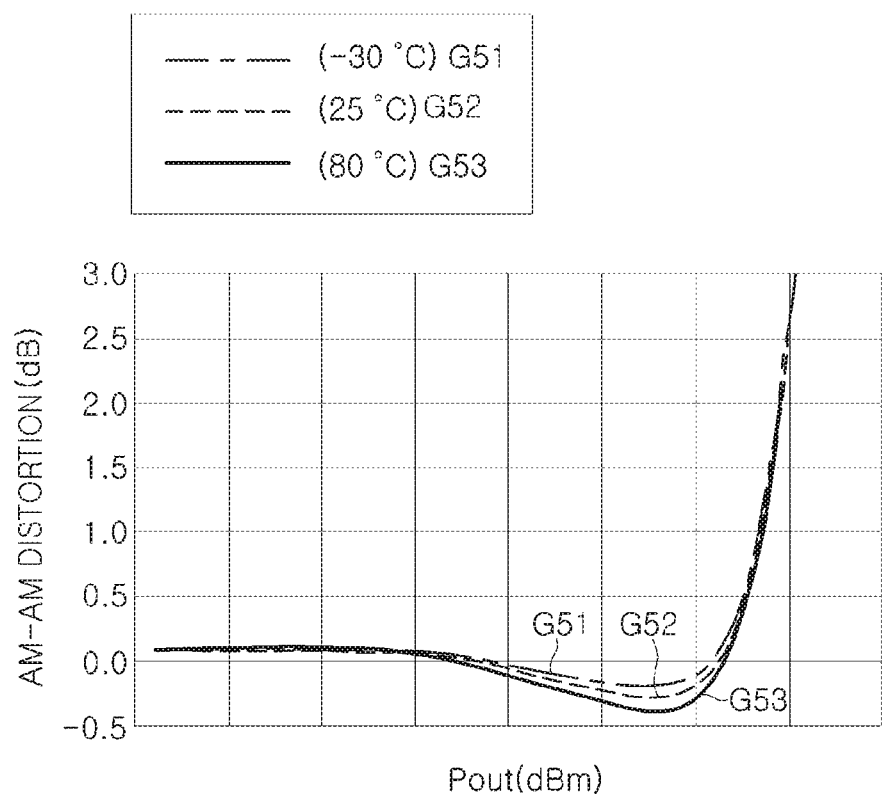

FIGS. 9A and 9B are graphs illustrating output power-AM-AM distortion characteristics according to a temperature change.

FIG. 9A is a graph of output power-AM-AM distortion characteristics according to a temperature change by a bias circuit according to the related art, while FIG. 9B is a graph of output power-AM-AM distortion characteristics according to a temperature change by a bias circuit according to an example described herein.

Respective G41, G42, and G43 of FIG. 9A are graphs of output power-AM-AM distortion characteristics according to a temperature change by a bias circuit according to the related art, at respective 3-points of −30 degrees (low temperature), 25 degrees (room temperature), and 80 degrees (high temperature). Respective G51, G52, and G53 of FIG. 9B are graphs of output power-AM-AM distortion characteristics according to a temperature change by a bias circuit according to an example described herein, at respective 3-points of −30 degrees (low temperature), 25 degrees (room temperature), and 80 degrees (high temperature).

Referring to G41, G42, and G43 of FIG. 9A, when a bias circuit according to the related art is applied, a deviation of output power-AM-AM distortion according to a temperature change is up to a level of 0.7 dB. Referring to G51, G52, and G53 of FIG. 9B, when a bias circuit according to an example described herein is applied, a deviation of output power-AM-AM distortion according to a temperature change is reduced up to 0.3 dB.

Figure 10A:
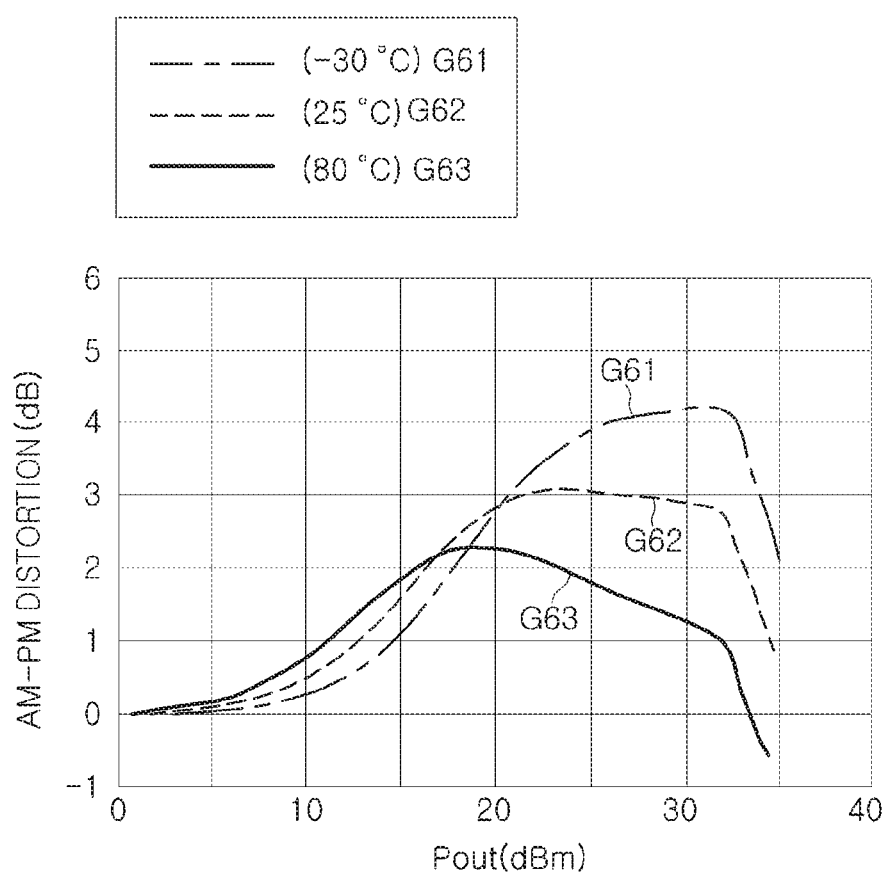
FIGS. 10A and 10B are graphs illustrating output power-AM-PM distortion characteristics according to a temperature change.
Figure 10B:
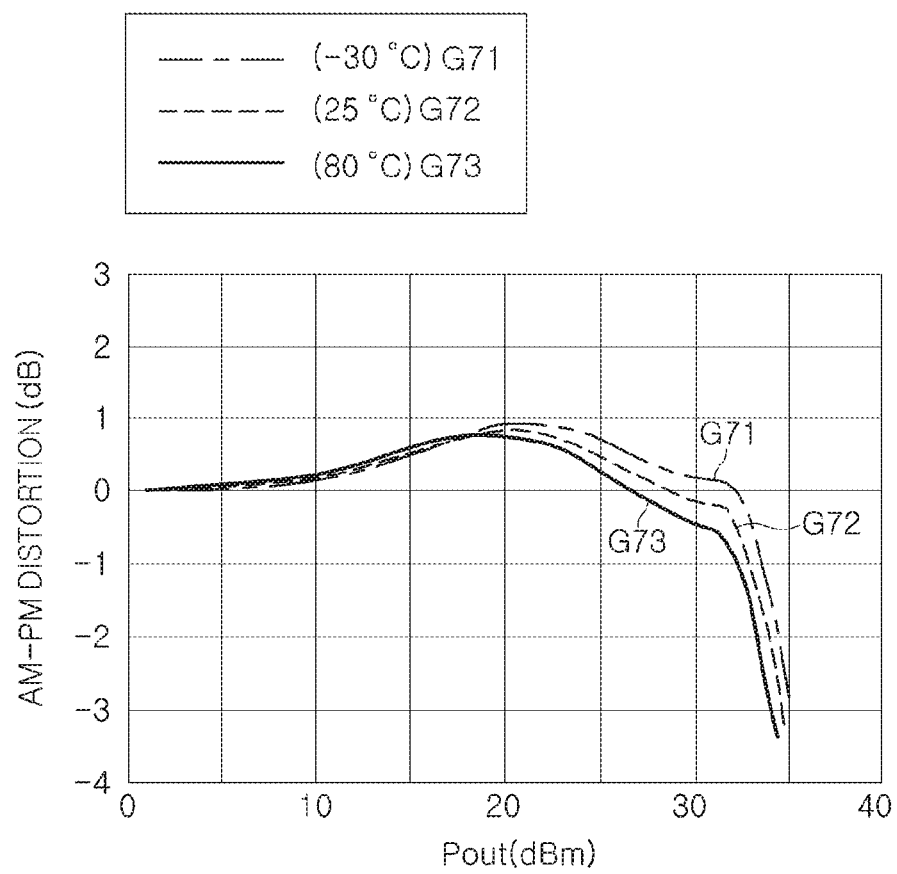

FIGS. 10A and 10B are graphs illustrating output power-AM-PM distortion characteristics according to a temperature change.

FIG. 10A is a graph of output power-AM-PM distortion characteristics according to a temperature change by a bias circuit according to the related art, while FIG. 10B is a graph of output power-AM-PM distortion characteristics according to a temperature change by a bias circuit according to an example described herein.

Respective G61, G62, and G63 of FIG. 10A are graphs of output power-AM-PM distortion characteristics according to a temperature change by a bias circuit according to the related art, at respective 3-points of −30 degrees (low temperature), 25 degrees (room temperature), and 80 degrees (high temperature). Respective G71, G72, and G73 of FIG. 10B are graphs of output power-AM-PM distortion characteristics according to a temperature change by a bias circuit according to an example described herein, at respective 3-points of −30 degrees (low temperature), 25 degrees (room temperature), and 80 degrees (high temperature).

Referring to G61, G62, and G63 of FIG. 10A, when a bias circuit according to the related art is applied, a deviation of output power-AM-PM distortion according to a temperature change is to a level of 3 deg (based on @30 dBm). Referring to G71, G72, and G73 of FIG. 10B, when a bias circuit according to an example described herein is applied, a deviation of output power-AM-PM distortion according to a temperature change is reduced to approximately 0.5 deg (based on @30 dBm).

Figure 11A:
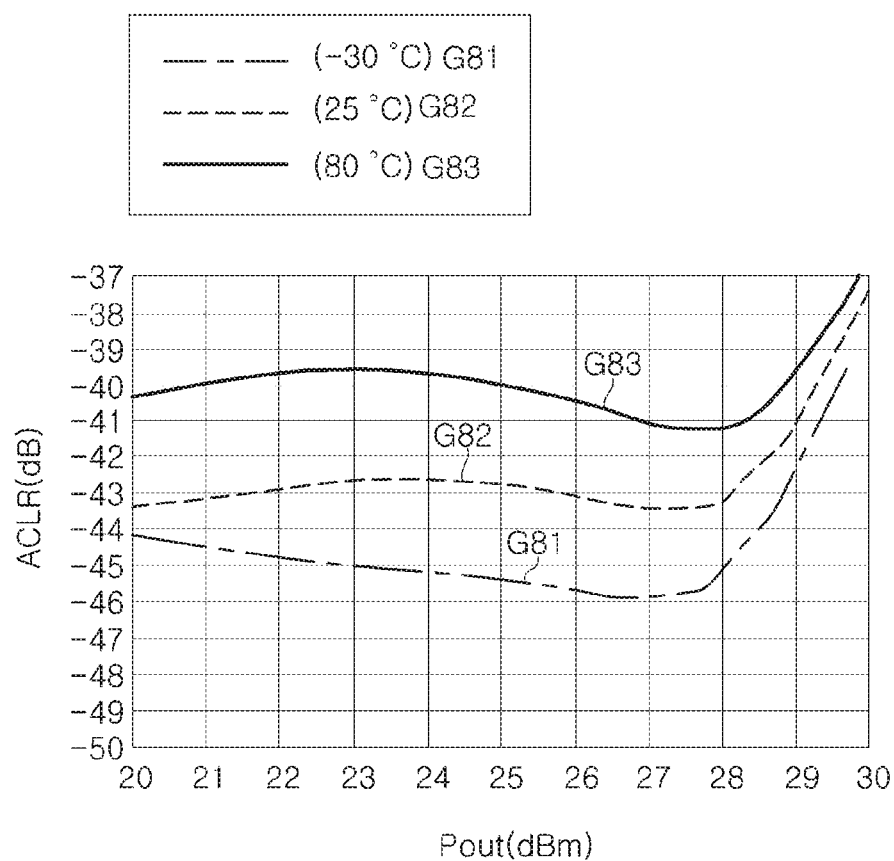
FIGS. 11A and 11B are graphs illustrating output power-ACLR characteristics according to a temperature change.
Figure 11B:
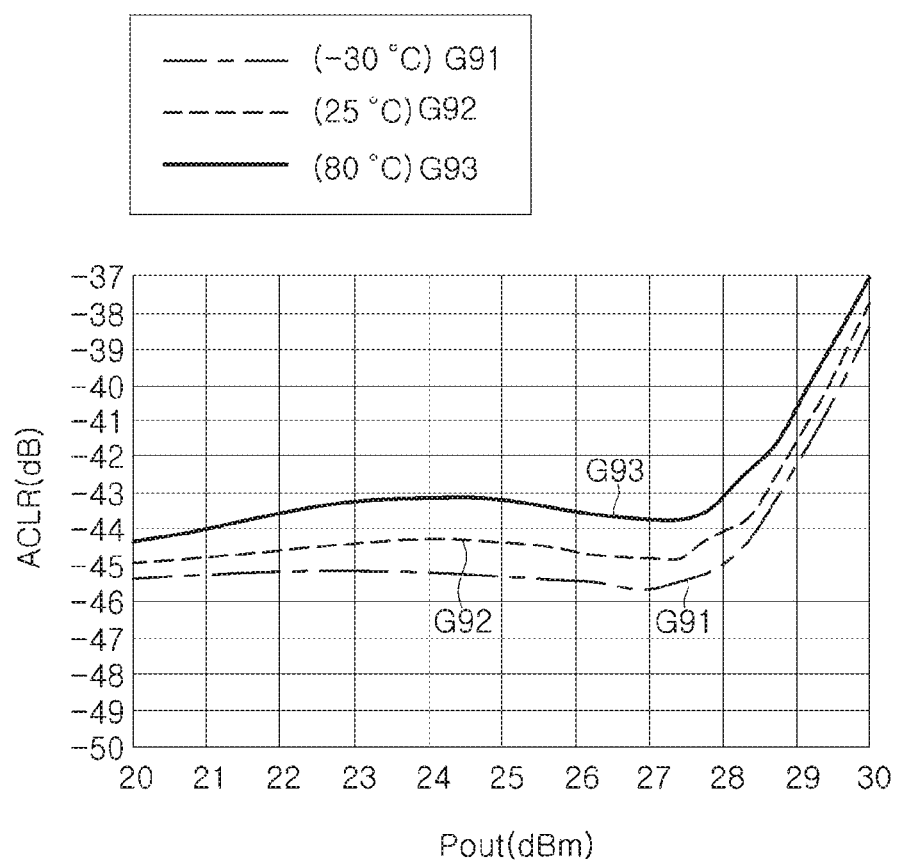

FIGS. 11A and 11B are graphs illustrating output power-adjacent channel leakage ratio (ACLR) characteristics according to a temperature change.

FIG. 11A is a graph of output power-ACLR characteristics according to a temperature change by a bias circuit according to the related art, while FIG. 11B is a graph of output power-ACLR characteristics according to a temperature change by a bias circuit according to an example described herein.

Respective G81, G82, and G83 of FIG. 11A are graphs of output power-ACLR characteristics according to a temperature change by a bias circuit according to the related art, at respective 3-points of −30 degrees (low temperature), 25 degrees (room temperature), and 80 degrees (high temperature). Respective G91, G92, and G93 of FIG. 11B are graphs of output power-ACLR characteristics according to a temperature change by a bias circuit according to an example described herein, at respective 3-points of −30 degrees (low temperature), 25 degrees (room temperature), and 80 degrees (high temperature).

Referring to G81, G82, and G83 of FIG. 11A, when a bias circuit according to the related art is applied, the output power-ACLR performance according to a temperature change is reduced by a maximum 5.5 dB. Referring to G91, G92, and G93 of FIG. 11B, when a bias circuit according to an example described herein is applied, the output power-ACLR performance according to a temperature change may be reduced by a maximum 2.5 dB. Here, it is confirmed that a degree of degradation of linearity may be reduced.

A control circuit of an amplifying device according to the examples described herein may be implemented as a computing environment, in which processors (for example, a central processing unit (CPU), a graphics processing unit (GPU), a microprocessor, an application specific integrated circuit (ASIC), field programmable gate arrays (FPGA), and the like), a memory (for example, a volatile memory (e.g., RAM, and the like), a non-volatile memory (e.g., ROM, a flash memory), and the like), input devices (for example, a keyboard, a mouse, a pen, a voice input device, a touch input device, an infrared camera, a video input device, and the like), output devices (for example, displays, speakers, printers, and the like), and communications access devices (for example, a modem, a network interface card (NIC), an integrated network interface, a radio frequency transmitter/receiver, an infrared port, a USB connection device, and the like) are interconnected to each other (for example, a Peripheral Component Interconnect (PCI), USB, firmware (IEEE 1394), an optical bus structure, a network, and the like).

The computing environment may be implemented as a distributed computing environment, including personal computers, server computers, handheld or laptop devices, mobile devices (mobile phones, PDAs, media players, and the like), multiprocessor systems, consumer electronics, minicomputers, mainframe computers, or the above systems or devices, but is not limited thereto.

In a current bias circuit, a dual temperature compensation function, in which an ambient temperature change is reflected, is used to efficiently compensate a base bias current, which may vary depending on an ambient temperature, and improve a performance deviation such as a gain deviation according to a temperature change, a deviation of AM-AM distortion, a deviation of linearity, and the like.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bias circuit, comprising:
   a current generating circuit configured to generate a first compensation current and a second compensation current, in which an ambient temperature change is reflected, based on a reference current;
   a first temperature compensation circuit configured to generate a first base bias current, based on the first compensation current, and output the first base bias current to a base node of an amplifying circuit; and
   a second temperature compensation circuit configured to generate a second base bias current, based on the second compensation current, and output the second base bias current to the base node of the amplifying circuit.

2. The bias circuit of claim 1, wherein the current generating circuit comprises:
   a first resistor having a first end connected to a terminal of the reference current;
   a second resistor having a first end connected to a second end of the first resistor; and
   a temperature compensation transistor connected between a second end of the second resistor and the ground, and connected to an amplifying transistor of the amplifying circuit while having a current mirror structure.

3. The bias circuit of claim 2, wherein the current generating circuit is configured to output the first compensation current at a first connection node between the first resistor and the second resistor, and output the second compensation current at a second connection node between the second resistor and a collector of the temperature compensation transistor.

4. The bias circuit of claim 3, wherein the temperature compensation transistor is configured to have the same temperature characteristics as the temperature characteristics of the amplifying transistor.

5. The bias circuit of claim 4, wherein the first temperature compensation circuit comprises:
   a first compensation transistor having a base connected to the first connection node, a collector connected to a terminal of a power supply voltage, and an emitter connected to the base node of the amplifying circuit.

6. The bias circuit of claim 5, wherein the first compensation transistor is configured to amplify the first compensation current, input to the base, to output the first base bias current through the emitter to the base node of the amplifying circuit.

7. The bias circuit of claim 6, wherein the second temperature compensation circuit comprises:
   a second compensation transistor having a base connected to the second connection node, a collector connected to the collector of the first compensation transistor, and an emitter connected to the base node of the amplifying circuit.

8. The bias circuit of claim 7, wherein the second compensation transistor is configured to amplify the second compensation current, input to the base, to output the second base bias current through the emitter to the base node of the amplifying circuit.

9. An amplifying device, comprising:
an amplifying circuit comprising an amplifying transistor; and
a bias circuit configured to generate a base bias current, in which a temperature is compensated, and to output the base bias current to a base node of the amplifying circuit,
wherein the bias circuit comprises:
a current generating circuit configured to generate a first compensation current and a second compensation current, in which an ambient temperature change is reflected, based on a reference current;
a first temperature compensation circuit configured to generate a first base bias current, based on the first compensation current, to output the first base bias current to the base node of the amplifying circuit; and
a second temperature compensation circuit configured to generate a second base bias current, based on the second compensation current, to output the second base bias current to the base node of the amplifying circuit.

10. The amplifying device of claim 9, wherein the current generating circuit comprises:
a first resistor having a first end connected to a terminal of the reference current;
a second resistor having a first end connected to a second end of the first resistor; and
a temperature compensation transistor connected between a second end of the second resistor and the ground, and connected to the amplifying transistor of the amplifying circuit while having a current mirror structure.

11. The amplifying device of claim 10, wherein the current generating circuit is configured to output the first compensation current at a first connection node between the first resistor and the second resistor, and output the second compensation current at a second connection node between the second resistor and a collector of the temperature compensation transistor.

12. The amplifying device of claim 11, wherein the temperature compensation transistor is configured to have the same temperature characteristics as the temperature characteristics of the amplifying transistor.

13. The amplifying device of claim 12, wherein the first temperature compensation circuit comprises:
a first compensation transistor having a base connected to the first connection node, a collector connected to a terminal of a power supply voltage, and an emitter connected to the base node of the amplifying circuit.

14. The amplifying device of claim 13, wherein the first compensation transistor is configured to amplify the first compensation current, input to the base, to output the first base bias current to the base node of the amplifying circuit through the emitter.

15. The amplifying device of claim 14, wherein the second temperature compensation circuit comprises:
a second compensation transistor having a base connected to the second connection node, a collector connected to the collector of the first compensation transistor, and an emitter connected to the base node of the amplifying circuit.

16. The amplifying device of claim 15, wherein the second compensation transistor is configured to amplify the second compensation current, input to the base, to output the second base bias current through the emitter to the base node of the amplifying circuit.

17. A 3-stage power amplifying circuit, comprising:
a first power amplifying circuit;
a second power amplifying circuit; and
a third power amplifying circuit comprising the bias circuit of claim 1.

18. A power amplifier circuit, comprising:
an amplifying circuit comprising a first transistor; and
a bias circuit comprising a second transistor that is a current mirror with the first transistor, and configured to generate a first base bias current and a second base bias current based on a change in ambient temperature and output the first base bias current and the second base bias current to a base node of the amplifying circuit, wherein a base of the second transistor is connected to the base node.

19. The power amplifier circuit of claim 18, wherein the bias circuit comprises a third transistor configured to generate the first base bias current and a fourth transistor configured to generate the second base bias current.

20. The power amplifier circuit of claim 18, further comprising a capacitor connected between the base of the second transistor and the base node.

* * * * *